United States Patent
Fiorini et al.

(10) Patent No.: US 10,554,178 B2
(45) Date of Patent: Feb. 4, 2020

(54) AMPLIFIER AND RADIATION DETECTOR

(71) Applicants: Horiba, Ltd., Kyoto-shi, Kyoto (JP); Politecnico di Milano, Milan (IT)

(72) Inventors: Carlo Fiorini, Milan (IT); Luca Bombelli, Milan (IT)

(73) Assignees: HORIBA, LTD., Kyoto (JP); POLITECNICO DI MILANO, Milan (IT)

( * ) Notice: Subject to any disclaimer, the term of this patent is extended or adjusted under 35 U.S.C. 154(b) by 0 days.

(21) Appl. No.: 15/704,496

(22) Filed: Sep. 14, 2017

(65) Prior Publication Data

US 2018/0006613 A1 Jan. 4, 2018

Related U.S. Application Data

(62) Division of application No. 14/418,633, filed as application No. PCT/JP2013/070680 on Jul. 31, 2013, now Pat. No. 9,768,737.

(30) Foreign Application Priority Data

Aug. 2, 2012 (JP) .................................. 2012-172331

(51) Int. Cl.
*H03F 1/26* (2006.01)
*H03F 3/45* (2006.01)
(Continued)

(52) U.S. Cl.
CPC ................. *H03F 1/26* (2013.01); *G01T 1/17* (2013.01); *G01T 1/24* (2013.01); *H03F 3/08* (2013.01);
(Continued)

(58) Field of Classification Search
CPC .. G01N 21/3504; G01N 21/255; G01N 21/71; H03F 1/26; G01T 1/17; G01T 1/24
See application file for complete search history.

(56) References Cited

U.S. PATENT DOCUMENTS 4,247,826 A   1/1981 Gappa et al.
4,977,367 A   12/1990 Johnston
(Continued)

FOREIGN PATENT DOCUMENTS

EP   0325383 A2   7/1989
EP   0746024 A2   12/1996
(Continued)

OTHER PUBLICATIONS

Decision to Grant dated Aug. 29, 2017 from Japanese Patent Application No. JP 2014-528184 and English translation.
(Continued)

*Primary Examiner* — Hugh Maupin
(74) *Attorney, Agent, or Firm* — Lucas & Mercanti, LLP (57) ABSTRACT

In a preamplifier (amplifier) for the radiation detector, an interconnection layer connected to the bonding pad forms one electrode of a feedback capacitor. Since there is no wiring for connecting the bonding pad and capacitor, a parasitic capacitance caused by the wiring will not be generated. Moreover, the capacitor is arranged below the bonding pad with a conductive layer serving as the other electrode, so that the feedback capacitance of the capacitor is included in the parasitic capacitance between the interconnection layer and the substrate. Compared to the conventional case, an amount of capacitance corresponding to the parasitic capacitance caused by wiring and the feedback capacitance for the capacitor is reduced from the input capacitance. Thus, the input capacitance for the amplifying circuit is reduced.

9 Claims, 9 Drawing Sheets

(51) Int. Cl.
*H03F 3/70* (2006.01)
*G01T 1/17* (2006.01)
*G01T 1/24* (2006.01)
*H03F 3/08* (2006.01)

(52) U.S. Cl.
CPC .......... *H03F 3/45475* (2013.01); *H03F 3/70* (2013.01); *H03F 2200/261* (2013.01); *H03F 2200/372* (2013.01); *H03F 2200/411* (2013.01); *H03F 2203/45512* (2013.01); *H03F 2203/45514* (2013.01); *H03F 2203/45536* (2013.01)

(56) References Cited

U.S. PATENT DOCUMENTS

| | | |
|---|---|---|
| 4,987,580 A | 1/1991 | Pelgrom et al. |
| 5,347,231 A | 9/1994 | Bertuccio et al. |
| 5,602,511 A | 2/1997 | Woolaway |
| 5,684,304 A | 11/1997 | Smears |
| 5,708,392 A | 1/1998 | Gross |
| 5,760,641 A | 6/1998 | Granger-Jones et al. |
| 6,023,095 A | 2/2000 | Hirabayashi |
| 6,252,462 B1 | 6/2001 | Hoffman |
| 6,426,672 B1 | 7/2002 | Petrick et al. |
| 6,587,003 B2 | 7/2003 | Jordanov |
| 2002/0113287 A1 | 8/2002 | Lee et al. |
| 2003/0010119 A1 | 1/2003 | Toyoda |
| 2005/0104003 A1 | 5/2005 | Jarron |
| 2006/0037393 A1 | 2/2006 | Itakura et al. |
| 2006/0138635 A1 | 6/2006 | Kawamoto |
| 2007/0201612 A1 | 8/2007 | Teng et al. |
| 2007/0228279 A1 | 10/2007 | Matsumoto et al. |
| 2008/0048732 A1 | 2/2008 | Oki |
| 2012/0080600 A1 | 4/2012 | Fujiyoshi et al. |
| 2013/0258153 A1* | 10/2013 | Fowler ............ H04N 5/37206 348/308 |
| 2015/0030132 A1 | 1/2015 | Nashashibi |

FOREIGN PATENT DOCUMENTS

| | | |
|---|---|---|
| JP | H01-239494 A | 9/1989 |
| JP | H02-003936 A | 1/1990 |
| JP | H02-247593 A | 10/1990 |
| JP | H05-180944 A | 7/1993 |
| JP | H05-275939 A | 10/1993 |
| JP | H06-112406 A | 4/1994 |
| JP | H07-263506 A | 10/1995 |
| JP | H08-330525 A | 12/1996 |
| JP | H10-221458 A | 8/1998 |
| JP | 10-275824 A | 10/1998 |
| JP | H11-54738 A | 2/1999 |
| JP | 11-122533 A | 4/1999 |
| JP | H11145737 A | 5/1999 |
| JP | 2000-058765 A | 2/2000 |
| JP | 2000504910 A | 4/2000 |
| JP | 2002016069 A | 1/2002 |
| JP | 2003-028824 A | 1/2003 |
| JP | 2003-100884 A | 4/2003 |
| JP | 2004-112077 A | 4/2004 |
| JP | 2004-288781 A | 10/2004 |
| JP | 2005-277194 A | 10/2005 |
| JP | 2005-327952 A | 11/2005 |
| JP | 2006-058084 A | 3/2006 |
| JP | 2007-53794 A | 3/2007 |
| JP | 2007-224903 A | 9/2007 |
| JP | 2007-271295 A | 10/2007 |
| JP | 2008-028754 A | 2/2008 |
| JP | 2009-041942 A | 2/2009 |
| JP | 2009-111069 A | 5/2009 |
| JP | 2012-079820 A | 4/2012 |
| WO | 9321660 A1 | 10/1993 |

OTHER PUBLICATIONS

Noulis T et al: "Noise optimized charge-sensitive CMOS amplifier for capacitive radiation detectors"; The Institution of Engineering and Technology 2008; Published in IET Circuits Devices Syst., 2008, vol. 2, No. 3, Jun. 12, 2008, pp. 324-334, doi; 10.1049/iet-cds: 20070223.

Ryan M Diestelhorst et al: "A monolithic, wide-temperature, charge amplification channel for extreme environments"; Aerospace Conference, 2010 IEEE, IEEE, Piscataway, NJ, USA, vol. q, Mar. 6, 2010, pp. 1-10, XP031657084.

Notification of Reasons for Refusal dated Aug. 28, 2018 from Japanese Patent Application No. JP 2017-187112 and English translation.

T. Nashashibi, "The Pentafet and Its Applications in High Resolution and High Rate Radiation Spectrometers," Nuclear Instruments and Methods in Physics Research A322, 1992, pp. 551-556.

L. Bombelli, et al., ""Cube", A Low-noise CMOS Preamplifier as Alternative to JFET Front-end for High-count Rate Spectroscopy," IEEE Nucleas Science Symposium Conference Record, 2011, pp. 1072-1075.

Shankara K. Prasad, "Advanced Wirebond Interconnection Technology," Kluwer Academic Publishers, p. 413 (4 pages).

WO 2012/156748 A1, corresponding to US 2015/030132 A1.

JP 2014-519261 A, corresponding to US 2015/030132 A1.

T. Nashashibi, "The Pentafet and Its Applications in High Resolution and High Rate Radiation Spectrometers;".

L. Bombelli, et al., ""CUBE", A Low-noise CMOS Preamplifier as Alternative to JFET Front-end for High-count Rate Spectroscopy;".

Shankara K. Prasad, "Advanced Wirebond Interconnection Technology;".

JP 2008-028754 A, corresponding to US 2008/048732 A1.

JP 2007-224903 A, corresponding to US 2007/201612 A1.

JP 2007-53794 A, corresponding to U.S. Pat. No. 5,760,641 A.

JP H01-239494 A, corresponding to U.S. Pat. No. 4,977,367 A.

* cited by examiner

FIG. 1

PRIOR ART

FIG. 2

PRIOR ART

FIG. 3

PRIOR ART

AMPLIFIER AND RADIATION DETECTOR

CROSS-REFERENCE TO RELATED APPLICATIONS

This is a Divisional Application of U.S. patent application Ser. No. 14/418,633, filed Jan. 30, 2015, now U.S. Pat. No. 9,768,737, issued Sep. 19, 2017, which was a 371 national phase application of PCT International Application No. PCT/JP2013/070680 filed Jul. 31, 2013, which claims the benefit of Japanese Patent Application No. 2012-172331, filed Aug. 2, 2012, the entire disclosure of each of which is incorporated herein by reference.

FIELD OF THE INVENTION

The present invention relates to a radiation detector, and more particularly, to an amplifier for converting a charge signal output from a radiation detecting element into a voltage signal and to a radiation detector including the amplifier.

BACKGROUND INFORMATION

A radiation detector for detecting radiation such as X-rays includes a radiation detecting element like, for example, SDD (Silicon Drift Detector). The radiation detecting element outputs a charge signal in accordance with detected radiation. The charge signal is converted into a voltage signal by a preamplifier. Signal processing including spectrum generation or the like is performed based on the voltage signal.

Figure 1:
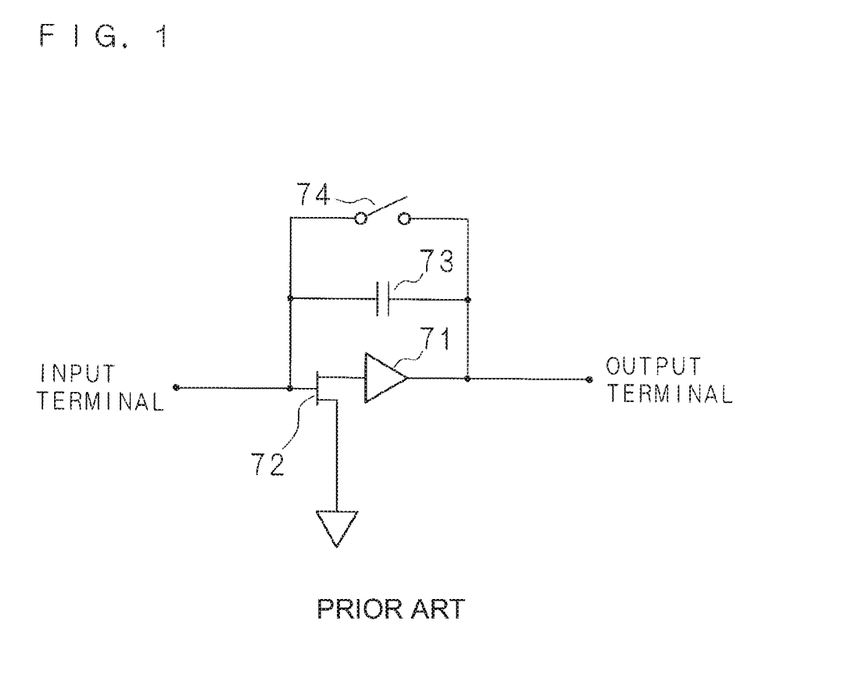
FIG. 1 is a circuit diagram of a preamplifier in the conventional radiation detector.

FIG. 1 is a circuit diagram of a preamplifier in the conventional radiation detector. A FET (Field Effect Transistor) 72 is connected at a stage preceding an amplifying circuit 71. A signal from the radiation detecting element is input to the amplifying circuit 71 through the FET 72. Moreover, each of a feedback capacitor 73 and a reset switch 74 is connected to be in parallel with the amplifying circuit 71 and FET 72. There are cases where the amplifying circuit 71 is configured with an operational amplifier and a transistor, where the amplifying circuit 71 is configured as an integrated circuit, and where the amplifying circuit 71 and FET 72 are configured as one integrated circuit.

Figure 2:
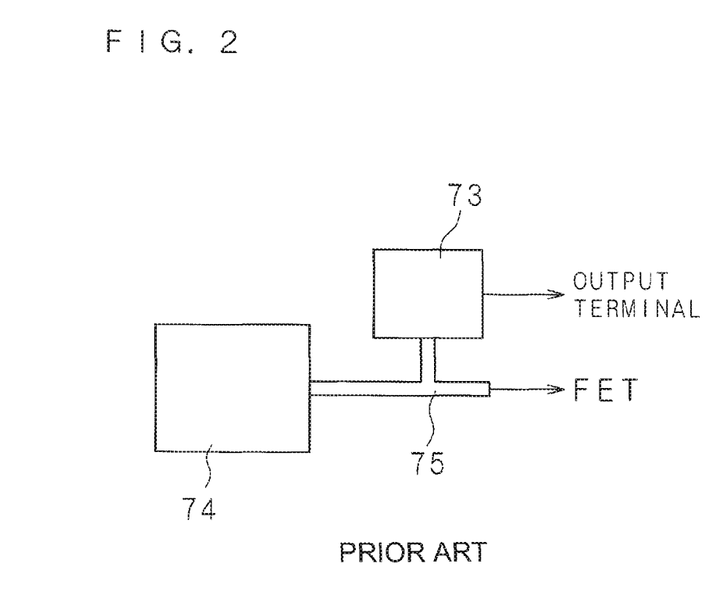
FIG. 2 is a schematic plan view illustrating a part of the structure of the conventional preamplifier formed as a chip.
Figure 3:
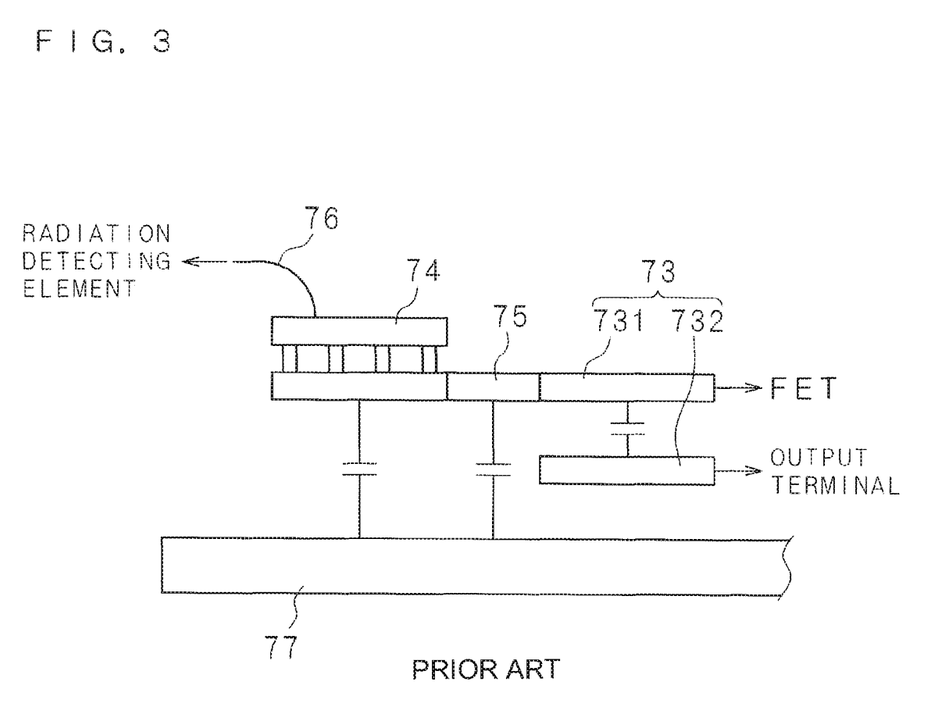
FIG. 3 is a schematic view illustrating a section of a part of the conventional preamplifier formed as a chip.

FIG. 2 is a schematic plan view illustrating a part of the structure of a conventional preamplifier formed as a chip. FIG. 3 is a schematic view illustrating a section of a part of the conventional preamplifier formed as a chip. A bonding pad for input is denoted by a reference number 74 in the drawings. The bonding pad 74 is connected to a bonding wire 76 further connected to a radiation detecting element. In the preamplifier, a metal wiring 75 is connected to the bonding pad 74 through an interconnection layer arranged below the bonding pad 74, while the feedback capacitor 73 is connected to the metal wiring 75. An electrode 731 at the upper side of the capacitor 73 is connected to the metal wiring 75 while an electrode 732 at the lower side thereof is connected to an output terminal of the preamplifier. The electrode 731 at the upper side of the capacitor 73 is also connected to the FET 72 through the metal wiring 75. The components in the preamplifier are formed on a silicon (Si) substrate 77 while a part excluding the upper surface of the bonding pad 74 is covered with an oxide film (not shown). Thus, the conventional preamplifier is formed as an integrated circuit. Japanese Patent Application Laid-Open No. 2000-58765 discloses an example of an integrated circuit including a bonding pad and a capacitor.

SUMMARY

As shown in FIG. 3, the conventional preamplifier causes a parasitic capacitance between an interconnection layer below the bonding pad 74 and, for example, the substrate 77, and also between the metal wiring 75 and, for example, the substrate 77. The parasitic capacitance is also caused in each of the radiation detecting element, bonding wire 76 and FET 72. Thus, the parasitic capacitance for each of the radiation detecting element, bonding wire 76, bonding pad 74, metal wiring 75 and FET 72 as well as the feedback capacitance of the capacitor 73 are included in the input capacitance for the amplifying circuit 71. As the input capacitance for the amplifying circuit becomes larger, noise included in a signal output by the preamplifier is increased. In the radiation detector including the preamplifier, the energy resolution is more deteriorated as the noise included in the signal is increased. It is thus necessary to reduce the input capacitance for the amplifying circuit to reduce the noise in order to improve the energy resolution of the radiation detector.

The present invention has been contrived in view of the above circumstances. An object of the invention is to provide an amplifier and a radiation detector with a reduced input capacitance for an amplifying circuit by making improvements in the arrangement of components in an integrated circuit.

In accordance with a first embodiment, an amplifier according to the present invention includes a semiconductor substrate; an amplifying circuit integrated on the semiconductor substrate; a feedback capacitor connected in parallel to the amplifying circuit; a first conductive layer directly or indirectly connected to an external bonding wire; a second conductive layer arranged on a side more toward the semiconductor substrate than the first conductive layer; and an insulating layer interposed between the first conductive layer and the second conductive layer, wherein the feedback capacitor is so configured that the insulating layer serves as a dielectric while the first conductive layer and the second conductive layer serve as a pair of electrodes, the first conductive layer is connected to an input terminal of the amplifying circuit, and the second conductive layer is connected to an output terminal of the amplifying circuit.

In accordance with another embodiment, the amplifier according to the present invention further includes a bonding pad for connection to the external bonding wire, wherein the first conductive layer has one part interposed between the bonding pad and the semiconductor substrate, and is connected to the bonding pad.

In accordance with another embodiment, the amplifier according to the present invention is characterized in that least parts of the bonding pad, the first conductive layer and the second conductive layer are orthogonally projected to the semiconductor substrate and overlap with one another.

In accordance with another embodiment, the amplifier according to the present invention is characterized in that the amplifying circuit includes a MOSFET connected to the input terminal.

In accordance with another embodiment, the amplifier according to the present invention is characterized in that the amplifying circuit includes a JFET connected to the input terminal.

In accordance with another embodiment, the amplifier according to the present invention is characterized in that the amplifying circuit includes a bipolar transistor connected to the input terminal.

A radiation detector according to the present invention is characterized by comprising: a radiation detecting element for generating a charge signal at the time of detecting radiation; and an amplifier according to the present invention for receiving a charge signal generated by the radiation detecting element through a bonding wire and converting the received charge signal into a voltage signal.

According to the present invention, in the amplifier used in the preamplifier for radiation detector, the feedback capacitor is configured with a first conductive layer connected to and located below the bonding pad for input or the first conductive layer also serving as the bonding pad and a second conductive layer located below the first conductive layer with the insulating layer interposed in between. Since there is no wiring for connecting the bonding pad and the capacitor, the parasitic capacitance due to the wiring will not occur.

According to the present invention, at least parts of the bonding pad, the first conductive layer and the second conductive layer that are orthogonally projected to the substrate overlap with one another. The capacitance for the portion overlapping the bonding pad of the capacitor is included in the parasitic capacitance between the first conductive layer below the bonding pad and, for example, the substrate. The input capacitance for the amplifying circuit in the preamplifier is reduced compared the conventional case by the amount corresponding to the feedback capacitance of the capacitor included in the parasitic capacitance between the first conductive layer and, for example, the substrate.

According to the present invention, the input capacitance for the amplifying circuit is reduced compared to the conventional case, while the noise included in the signal output from the amplifier is also reduced compared to the conventional case. In the radiation detector using the amplifier as a preamplifier, therefore, the noise included in the output voltage signal is reduced compared to the conventional case, while the energy resolution in the radiation detection is improved. The present invention can, therefore, present such beneficial effects.

The above and further objects and features of the invention will more fully be apparent from the following detailed description with accompanying drawings.

DETAILED DESCRIPTIONS

The present invention will now be described below in detail with reference to the drawings illustrating the embodiments thereof.

Embodiment 1

Figure 4:
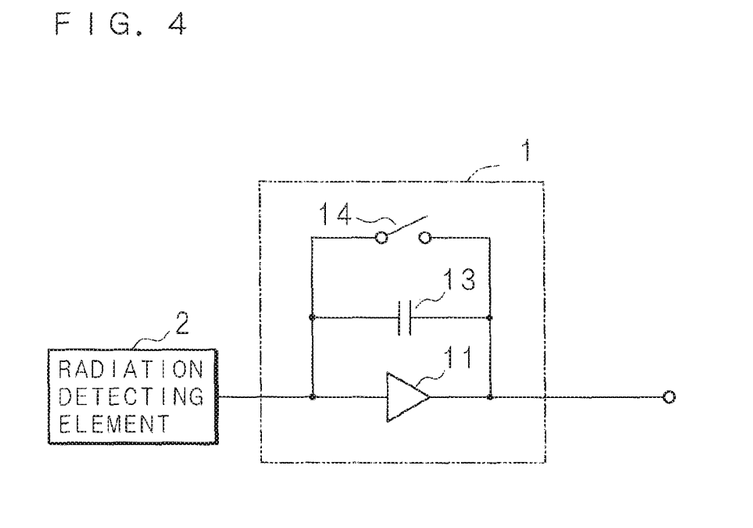
FIG. 4 is a schematic circuit diagram of a radiation detector according to the present invention.

FIG. 4 is a schematic circuit diagram of a radiation detector according to the present invention. The radiation detector includes a radiation detecting element 2 for detecting radiation such as X-rays. The radiation detecting element 2 is a semiconductor detecting element such as a SDD. The radiation detecting element 2 generates a charge signal in proportion to radiation energy upon entrance of radiation. The output terminal of the radiation detecting element 2 is connected to a preamplifier 1. The preamplifier 1 is an amplifier of the present invention. The radiation detecting element 2 outputs a charge signal, while the preamplifier 1 converts the charge signal output from the radiation detecting element 2 into a voltage signal proportionate to the energy of radiation. The output terminal of preamplifier 1 is connected to the output terminal of the radiation detector.

The radiation detector is included in, for example, an X-ray detection apparatus, the output terminal of the radiation detector being connected to the signal processing unit via an amplifier in the X-ray detection apparatus. The voltage signal output by the radiation detector is amplified by the amplifier and processed in a signal processing unit. For example, the signal processing unit counts a voltage signal for each value to obtain spectra of the detected X-rays. In another example, the radiation detector is included in an X-ray fluorescence spectrometer, which detects fluorescent X-rays emitted from a sample and performs an X-ray fluorescence analysis on the sample.

The preamplifier 1 includes an amplifying circuit 11 with an input terminal thereof connected to the radiation detecting element 2. A charge signal from the radiation detecting element 2 is input to the amplifying circuit 11. The FET required for inputting signals to the amplifying circuit 11 is included in the amplifying circuit 11. Moreover, each of the feedback capacitor 13 and the reset switch 14 is connected in parallel with the amplifying circuit 11. That is, each of the capacitor 13 and switch 14 is connected between the input terminal and the output terminal of the amplifying circuit 11. The preamplifier 1 is configured as an integrated circuit formed as a chip.

Figure 5:
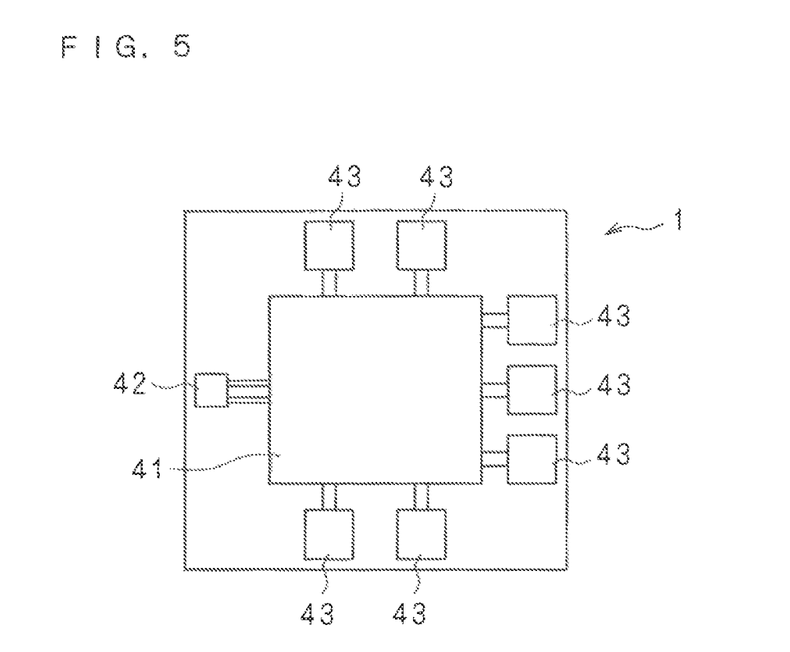
FIG. 5 is a schematic plan view of a preamplifier 1 formed as a chip.

FIG. 5 is a schematic plan view of the preamplifier 1 formed as a chip. A core area 41 including the amplifying circuit 11 is provided, around which a plurality of bonding pads 43 are arranged. The bonding pads 43 are connected to the core area 41 and are used for supplying power, outputting a voltage signal and inputting a pulse for resetting. Any one of the bonding pads 43 is connected to the output terminal of the amplifying circuit 11 and serves as an output terminal of the preamplifier 1. A bonding pad 42 for input is further arranged around the core area 41. The boding pad 42 for input corresponds to the bonding pad in the present invention. The radiation detecting element 2 is connected to the bonding pad 42 through a bonding wire (not shown in FIG. 5).

Figure 6:
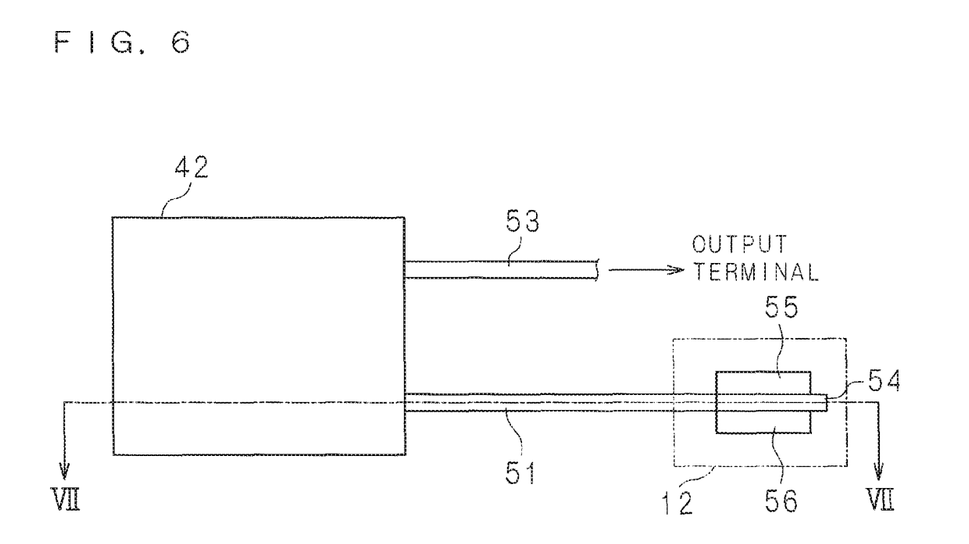
FIG. 6 is a schematic plan view illustrating the configuration of a part of a preamplifier according to Embodiment 1.
Figure 7:
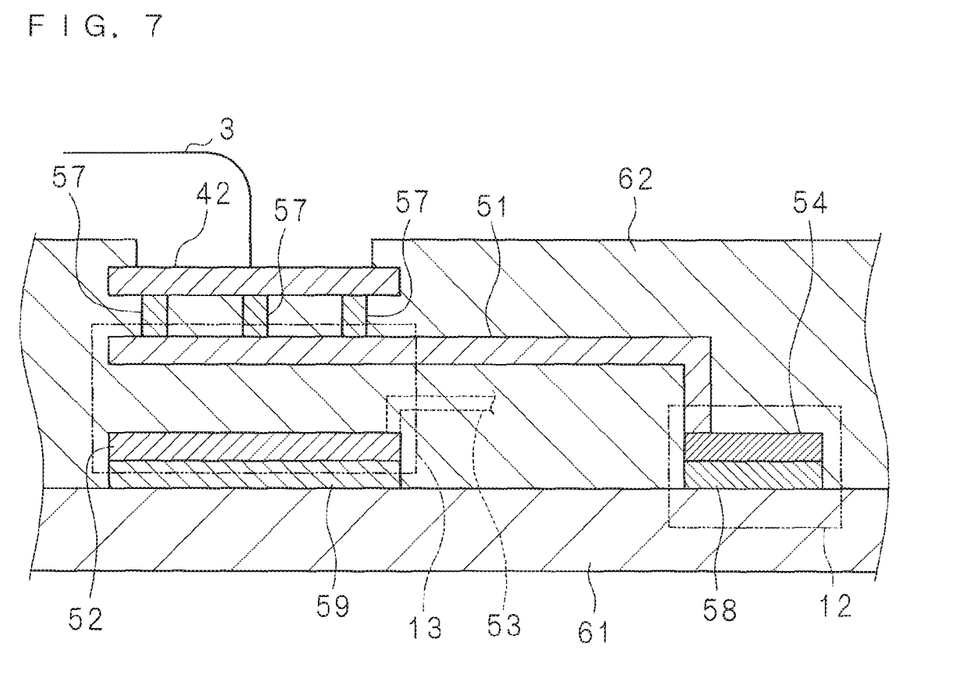
FIG. 7 is a schematic section view along the line VII-VII in FIG. 6.

FIG. 6 is a schematic plan view illustrating the configuration of a part of the preamplifier 1 according to Embodiment 1. FIG. 7 is a schematic section view along the line VII-VII in FIG. 6. FIGS. 6 and 7 show the bonding pad 42 for input and a portion in the vicinity of the bonding pad 42. The preamplifier 1 has a configuration in which a circuit is integrated on a substrate 61 of Si. The substrate 61 and an oxide film 62 are not illustrated in FIG. 6. The bonding pad 42 is formed to be connected to a bonding wire 3 connected to the radiation detecting element 2. Moreover, FIG. 6 shows each of the components orthogonally projected to the substrate 61.

A conductive interconnection layer 51 made of aluminum (Al) is provided below the bonding pad 42, i.e. between the bonding pad 42 and the substrate 61. The interconnection layer 51 corresponds to the first conductive layer in the present invention. A portion of the interconnection layer 51 located between the bonding pad 42 and the substrate 61 has a projection area orthogonal to the substrate 61 which is approximately equal to that of the bonding pad 42. Thus, the bonding pad 42 is substantially superposed above this portion of the interconnection layer 51 in plan view. Though hidden by the bonding pad 42 in FIG. 6, the interconnection layer 51 is located below the bonding pad 42. An insulating oxide film 62 formed of silicon dioxide is disposed between the bonding pad 42 and the interconnection layer 51. Via holes 57 penetrating the oxide film 62 is formed between the bonding pad 42 and the interconnection layer 51, while the bonding pad 42 is connected to the interconnection layer 51 through the via holes 57.

The interconnection layer 51 further extends in a linear form to the outside the region below the bonding pad 42. The extended interconnection layer 51 is connected to the gate electrode 54 formed with a poly-silicon (poly-Si) layer. A source electrode 55 is provided at one side of the gate electrode 54 and a drain electrode 56 is provided at the other side. A gate oxide film 58 is formed below the gate electrode 54, i.e. between the gate electrode 54 and the substrate 61. The gate oxide film 58 is in contact with the gate electrode 54 and the substrate 61. The gate electrode 54, source electrode 55, drain electrode 56 and gate oxide film 58 are included in a MOSFET (Metal Oxide Semiconductor FET) 12 for input which is embedded in the amplifying circuit 11. In other words, the interconnection layer 51 is connected to the gate electrode 54 to thereby be connected to the input terminal of the amplifying circuit 11. It is noted that the amplifying circuit 11 may be configured to include a JFET (Junction FET) or a bipolar transistor instead of MOSFET 12.

A conductive layer 52 formed with a conductive poly-Si layer is disposed below the interconnection layer 51, i.e. between the interconnection layer 51 and the substrate 61. The conductive layer 52 corresponds to the second conductive layer in the present invention. An insulating oxide film 59 is formed between the conductive layer 52 and the substrate 61. A large part of the conductive layer 52 is overlapped by the bonding pad 42 in a plan view when projected orthogonally to the substrate 61. Though hidden by the bonding pad 42 in FIG. 6, the conductive layer 52 is located below the interconnection layer 51 which is below the bonding pad 42. That is, a large part of the conductive layer 52 is arranged directly below the bonding pad 42. Moreover, the interconnection layer 51 and the conductive layer 52 are arranged in substantially parallel with each other, while an insulating oxide film 62 is interposed between the interconnection layer 51 and the conductive layer 52. Furthermore, as indicated by the broken line in FIG. 7, the conductive layer 52 is connected to another interconnection layer 53, which is connected to the output terminal of the amplifier 11. Except for the upper surface of the bonding pad 42, each part of the preamplifier 1 is covered with the oxide film 62. It is noted that the conductive layer 52 may be a metal interconnection layer. Furthermore, the interconnection layer 51 and the conductive layer 52 may be arranged to overlap with each other in at least a part thereof in plan view.

Since the insulating oxide film 62 is interposed between the conductive interconnection layer 51 and the conductive layer 52, a capacitor, with the interconnection layer 51 and the conductive layer 52 serving as a pair of electrodes while the oxide film 62 serves as a dielectric, is formed. The oxide film 62 between the interconnection layer 51 and the conductive layer 52 corresponds to the insulating layer in the present invention. The interconnection layer 51 which is one electrode is connected to the input terminal of the amplifying circuit 11, while the conductive layer 52 which is the other electrode is connected to the output terminal of the amplifier 11 through the interconnection layer 53, which makes this capacitor be the feedback capacitor 13.

As has been described above, in the preamplifier 1, the interconnection layer 51 connected to the bonding pad 42 serves as one electrode of the feedback capacitor 13. Thus, there is no wiring for connecting the bonding pad 42 and the capacitor 13, preventing the parasitic capacitance, which is generated in the conventional preamplifier due to such wiring, from being generated. Accordingly, the input capacitance for the amplifying circuit 11 is reduced compared to the conventional preamplifier. It is also possible to adjust the capacitance of the feedback capacitor 13 at the time of manufacturing, by adjusting the area in which the interconnection layer 51 and conductive layer 52 overlap with each other.

Moreover, in the present embodiment, the bonding pad 42, interconnection layer 51 and conductive layer 52, which are projected orthogonally to the substrate 61, overlap with one another. It is assumed here that the area of the bonding pad 42, the area of the interconnection layer 51 below the bonding pad 42, the thickness of the oxide film 62 between the interconnection layer 51 and the substrate 61, and the permittivity of the oxide film 62 are equal to those in the conventional preamplifier. Here, the parasitic capacitance between the interconnection layer 51 below the bonding pad 42 and, for example, the substrate 61 will be the same as that in the conventional preamplifier. In the preamplifier 1 according to the present embodiment, on the other hand, the capacitor 13 is disposed below the bonding pad 42 with the interconnection layer 51 serving as one electrode, allowing the feedback capacitance of the capacitor 13 to be included in the parasitic capacitance between the interconnection layer 51 and, for example, the substrate 61. Compared to the conventional preamplifier including a feedback capacitance in addition to the parasitic capacitance caused by the bonding pad, the preamplifier 1 according to the present embodiment has a reduced input capacitance for the amplifying circuit 11 by the amount of the feedback capacitance of the capacitor 13.

As described above, the preamplifier 1 according to the present embodiment has a reduced input capacitance for the amplifying circuit 11 compared to the conventional case. Thus, the noise included in the signal output by the preamplifier 1 is reduced compared to the conventional case. By integrating the circuit including the amplifying circuit 11 on the substrate 61, the preamplifier 1 is formed at low cost while noise may sufficiently be reduced. In the radiation detector including the preamplifier 1, the noise included in the output voltage signal is reduced compared to the conventional case, improving the energy resolution for radiation detection. Thus, the X-ray detection apparatus provided with the radiation detector according to the present embodiment, for example, can detect X-rays with a high resolution. In addition, the X-ray fluorescence spectrometer provided with the radiation detector according to the present embodiment, for example, can perform highly accurate X-ray fluorescence analysis.

Note that the preamplifier 1 may have a form in which only a part of the portion configuring the capacitor 13 in the interconnection layer 51 and the conductive layer 52 on the projection plane orthogonally projected to the substrate 61 is overlapped by the bonding pad 42. Among the capacitance for the capacitor 13, the capacitance for the portion overlapping the bonding pad 42 on the projection plane is included in the parasitic capacitance between the interconnection layer 51 and, for example, the substrate 61. Thus, the input capacitance for the amplifying circuit 11 is reduced compared to the conventional case by the amount of the capacitance for the above-described portion. The input capacitance for the amplifying circuit 11 is reduced compared to the conventional case also in the preamplifier 1 according to the embodiment, while the noise included in the output signal is reduced compared to the conventional case.

Embodiment 2

Figure 8:
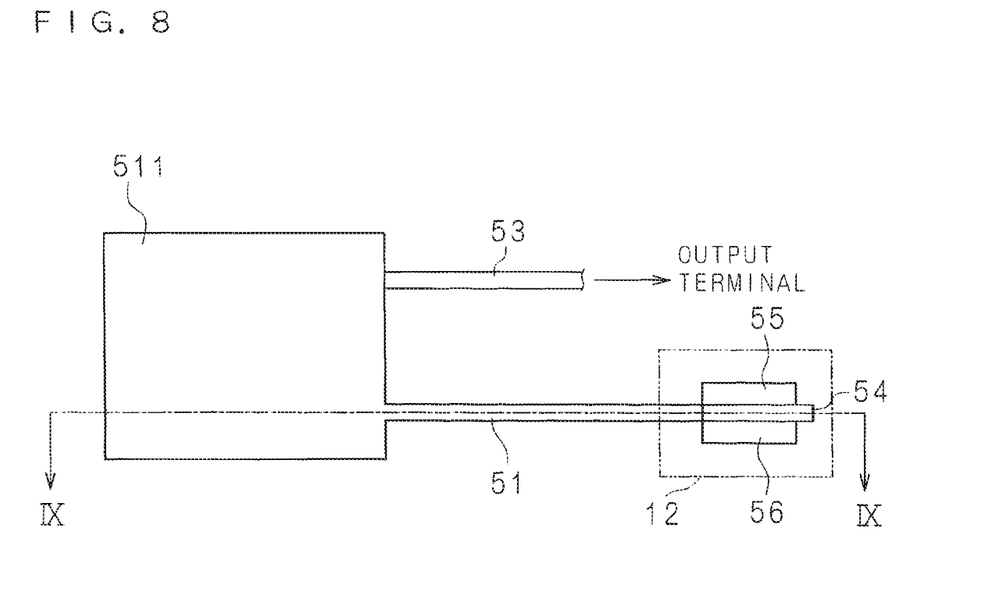
FIG. 8 is a schematic plan view illustrating the configuration of a part of a preamplifier according to Embodiment 2.
Figure 9:
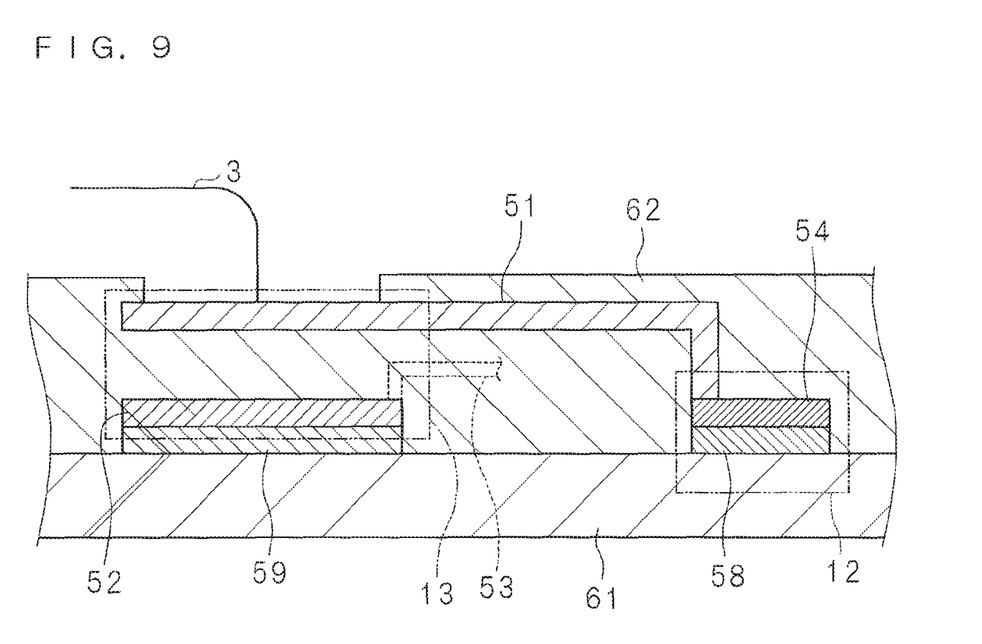
FIG. 9 is a schematic section view along the line IX-IX in FIG. 8.

FIG. 8 is a schematic plan view illustrating the configuration of a part of the preamplifier 1 according to Embodiment 2. FIG. 9 is a schematic section view along the line IX-IX in FIG. 8. FIG. 8 is a view formed by projecting each component orthogonally to a substrate 61, while the substrate 61 and an oxide film 62 are not shown. In the present embodiment, a preamplifier 1 does not include a bonding pad 42 and via holes 57. A part of an interconnection layer 51 forms a connection portion 511 also serving as a bonding pad. The connection portion 511 has an area large enough to be connected to a bonding wire 3 connected to a radiation detecting element 2. The upper surface of the connection portion 511 is not covered with the oxide film 62, so that the connection portion 511 is connected to the bonding wire 3. The conductive layer 52 is interposed between the connection portion 511 of the interconnection layer 51 and the substrate 61. A large part of the conductive layer 52 overlaps the connection portion 511 in a plan view formed by orthogonal projection to the substrate 61. Moreover, the insulating oxide film 62 is interposed between the connection portion 511 of the interconnection layer 51 and the conductive layer 52. The other configuration parts of the preamplifier 1 are similar to those in Embodiment 1. It is noted that the connection portion 511 and the conductive layer 52 may overlap with each other in at least a part thereof in plan view.

In the present embodiment also, a capacitor is configured with the interconnection layer 51 and the conductive layer 52 serving as a pair of electrodes and with the oxide film 62 serving as a dielectric, the capacitor corresponding to the feedback capacitor 13. Since there is no wiring for connecting the bonding pad and the capacitor 13, the parasitic capacitance generated at the conventional preamplifier due to the wiring will not be generated. Accordingly, the input capacitance for the amplifying circuit 11 is reduced compared to the case with the conventional preamplifier. In addition, as the connection portion 511 of the interconnection layer 51 forms one electrode of the capacitor 13, the feedback capacitance of the capacitor 13 is included in the parasitic capacitance between the interconnection layer 51 and the substrate 61. Compared to the conventional preamplifier having a feedback capacitance in addition to the parasitic capacitance caused by the bonding pad, the preamplifier 1 has a reduced input capacitance for the amplifying circuit 11 by the amount of the feedback capacitance for the capacitor 13. As described above, also in the preamplifier 1 according to the present embodiment, the input capacitance for the amplifying circuit 11 is reduced compared to the conventional case, and thus the noise included in the signal output from the preamplifier 1 is also reduced compared to the conventional case. The radiation detector including the preamplifier 1 has an improved energy resolution for detecting radiation. An X-ray detection apparatus including the radiation detector can detect X-rays with high resolution.

It is noted that the minimum configuration of the preamplifier 1 is described in Embodiments 1 and 2, while the preamplifier 1 may include circuit devices other than the circuit devices illustrated in Embodiments 1 and 2. Moreover, though Embodiments 1 and 2 described examples where a semiconductor detecting element is used as the radiation detecting element, the radiation detector of the present invention may use any other radiation detecting element which outputs charge signals in accordance with detected radiation.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. An amplifier connected to an output terminal of a radiation detecting element, comprising:
    a semiconductor substrate;
    an amplifying circuit;
    a feedback capacitor connected in parallel to the amplifying circuit;
    a reset switch integrated on the semiconductor substrate and connected in parallel to the amplifying circuit;
    a bonding pad for connection to a bonding wire connected to the radiation detecting element;
    a first conductive layer having one part interposed between the bonding pad and the semiconductor substrate and being connected to the bonding pad;
    a second conductive layer arranged on a side more toward the semiconductor substrate than the first conductive layer; and
    a insulating layer interposed between the first conductive layer and the second conductive layer, wherein
    the feedback capacitor is so configured that the insulating layer serves as a dielectric while the first conductive layer and the second conductive layer serve as a pair of electrodes,
    the first conductive layer is connected to an input terminal of the amplifying circuit,
    the second conductive layer is connected to an output terminal of the amplifying circuit, and
    at least parts of the bonding pad, the first conductive layer, the second conductive layer, and the semiconductor substrate are arranged one above the other in a direction orthogonal to a surface of the semiconductor substrate.

2. The amplifier according to claim 1, wherein
    the amplifying circuit includes a MOSFET connected to the input terminal.

3. The amplifier according to claim 1, wherein
the amplifying circuit includes a JFET connected to the input terminal.

4. The amplifier according to claim 1, wherein
the amplifying circuit includes a bipolar transistor connected to the input terminal.

5. The amplifier according to claim 1, further comprising an insulating film disposed between the second conductive layer and the semiconductor substrate.

6. A radiation detector, comprising:
a radiation detecting element for generating a charge signal at the time of detecting radiation; and
an amplifier connected to an output terminal of the radiation detecting element through a bonding wire, the amplifier including:
a semiconductor substrate;
an amplifying circuit;
a feedback capacitor connected in parallel to the amplifying circuit;
a reset switch integrated on the semiconductor substrate and connected in parallel to the amplifying circuit;
a bonding pad for connection to a bonding wire connected to the radiation detecting element;
a first conductive layer including one part interposed between the bonding pad and the semiconductor substrate and being connected to the bonding pad;
a second conductive layer arranged on a side more toward the semiconductor substrate than the first conductive layer; and
a insulating layer interposed between the first conductive layer and the second conductive layer, wherein
the feedback capacitor is so configured that the insulating layer serves as a dielectric while the first conductive layer and the second conductive layer serve as a pair of electrodes,
the first conductive layer is connected to an input terminal of the amplifying circuit,
the second conductive layer is connected to an output terminal of the amplifying circuit, and
at least parts of the bonding pad, the first conductive layer, the second conductive layer, and the semiconductor substrate are arranged one above the other in a direction orthogonal to a surface of the semiconductor substrate.

7. The amplifier according to claim 5, wherein the insulating film is disposed directly on the semiconductor substrate and the second conductive layer is disposed directly on the insulating film.

8. An amplifier connected to an output terminal of a radiation detecting element, comprising:
a semiconductor substrate;
an amplifying circuit;
a feedback capacitor connected in parallel to the amplifying circuit;
a reset switch integrated on the semiconductor substrate and connected in parallel to the amplifying circuit;
a first conductive layer having a connection portion for connection to a bonding wire connected to the radiation detecting element;
a second conductive layer arranged on a side more toward the semiconductor substrate than the first conductive layer; and
a insulating layer interposed between the first conductive layer and the second conductive layer, wherein
the feedback capacitor is so configured that the insulating layer serves as a dielectric while the connection portion and the second conductive layer serve as a pair of electrodes,
the first conductive layer is connected to an input terminal of the amplifying circuit,
the second conductive layer is connected to an output terminal of the amplifying circuit, and
at least parts of the connection portion, the second conductive layer, and the semiconductor substrate are arranged one above the other in a direction orthogonal to a surface of the semiconductor substrate.

9. A radiation detector, comprising:
a radiation detecting element for generating a charge signal at the time of detecting radiation; and
an amplifier connected to an output terminal of the radiation detecting element through a bonding wire, the amplifier includes:
a semiconductor substrate;
an amplifying circuit;
a feedback capacitor connected in parallel to the amplifying circuit;
a reset switch integrated on the semiconductor substrate and connected in parallel to the amplifying circuit;
a first conductive layer having a connection portion for connection to a bonding wire connected to the radiation detecting element;
a second conductive layer arranged on a side more toward the semiconductor substrate than the first conductive layer; and
a insulating layer interposed between the first conductive layer and the second conductive layer, wherein
the feedback capacitor is so configured that the insulating layer serves as a dielectric while the connection portion and the second conductive layer serve as a pair of electrodes,
the first conductive layer is connected to an input terminal of the amplifying circuit,
the second conductive layer is connected to an output terminal of the amplifying circuit, and
at least parts of the connection portion, the second conductive layer, and the semiconductor substrate are arranged one above the other in a direction orthogonal to a surface of the semiconductor substrate.

* * * * *